United States Patent
Choi et al.

(10) Patent No.: US 7,256,444 B2
(45) Date of Patent: Aug. 14, 2007

(54) LOCAL SONOS-TYPE NONVOLATILE MEMORY DEVICE AND METHOD OF MANUFACTURING THE SAME

(75) Inventors: Yong-suk Choi, Seoul (KR); Seung-beom Yoon, Suwon-si (KR); Seong-gyun Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 11/365,147

(22) Filed: Mar. 1, 2006

(65) Prior Publication Data

US 2006/0148172 A1 Jul. 6, 2006

Related U.S. Application Data

(62) Division of application No. 10/888,660, filed on Jul. 9, 2004, now Pat. No. 7,037,781.

(30) Foreign Application Priority Data

Sep. 9, 2003 (KR) .................................. 03-63355

(51) Int. Cl.
*H01L 29/76* (2006.01)
(52) U.S. Cl. ............... 257/314; 257/315; 257/E21.662; 257/E21.679; 257/E27.102
(58) Field of Classification Search ................ 257/314, 257/315, E21.662, E21.679, E27.102, E27.103, 257/E29.309
See application file for complete search history.

(56) References Cited

U.S. PATENT DOCUMENTS

| | | | |
|---|---|---|---|
| 6,248,633 B1 * | 6/2001 | Ogura et al. | 438/267 |
| 6,384,450 B1 | 5/2002 | Hidaka et al. | 257/321 |
| 6,518,110 B2 | 2/2003 | Wen | 438/201 |
| 6,559,500 B2 * | 5/2003 | Torii | 257/315 |
| 6,583,009 B1 | 6/2003 | Hui et al. | 438/264 |
| 6,686,632 B2 * | 2/2004 | Ogura et al. | 257/374 |
| 6,844,587 B2 * | 1/2005 | Kang | 257/316 |
| 6,927,131 B2 * | 8/2005 | Kim | 438/261 |
| 6,955,963 B2 | 10/2005 | Deleonibus et al. | 438/257 |
| 7,060,560 B2 * | 6/2006 | Wu et al. | 438/257 |

* cited by examiner

*Primary Examiner*—Thao P. Le
(74) *Attorney, Agent, or Firm*—Mills & Onello, LLP

(57) ABSTRACT

Provided are a local SONOS-type memory device and a method of manufacturing the same. The device includes a gate oxide layer formed on a silicon substrate; a conductive spacer and a dummy spacer, which are formed on the gate oxide layer and separated apart from each other, the conductive spacer and the dummy spacer having round surfaces that face outward; a pair of insulating spacers formed on a sidewall of the conductive spacer and a sidewall of the dummy spacer which face each other; an ONO layer formed in a self-aligned manner between the pair of insulating spacers; a conductive layer formed on the ONO layer in a self-aligned manner between the pair of insulating spacers; and source and drain regions formed in the silicon substrate outside the conductive spacer and the dummy spacer.

7 Claims, 10 Drawing Sheets

# LOCAL SONOS-TYPE NONVOLATILE MEMORY DEVICE AND METHOD OF MANUFACTURING THE SAME

RELATED APPLICATIONS

This application is a divisional of U.S. application Ser. No. 10/888,660, filed on Jul. 9, 2004, now U.S. Pat. No. 7,037,781 which relies for priority upon Korean Patent Application No. 10-2003-0063355, filed on Sep. 9, 2003, the contents of which are herein incorporated by reference in their entirety.

BACKGROUND OF THE INVENTION

1. Field of the Invention

The present invention relates to a local silicon-oxide-nitride-oxide-silicon (SONOS)-type nonvolatile memory device and a method of manufacturing the same. More particularly, the present invention relates to a local SONOS-type nonvolatile memory device in which an oxide-nitride-oxide (ONO) layer and a control gate are formed in a self-aligned manner, and a method of manufacturing the same.

2. Description of the Related Art

A nonvolatile memory device can electrically erase and store data and retain data even if power supply is interrupted. The nonvolatile memory device has increasingly been applied in various fields such as mobile communication systems and memory cards. In recent years, a nonvolatile memory device having floating-gate-type cells has been widely used. However, as the integration density of semiconductor devices increases, it becomes more difficult to scale down and pattern cells. For this reason, a nonvolatile memory device having SONOS cells (hereinafter, a SONOS-type nonvolatile memory device) was proposed as a substitute for the floating-gate-type nonvolatile memory device. The SONOS-type memory device can be integrally formed with peripheral regions and/or logic regions of an integrated circuit (IC), and the manufacture thereof is relatively simple.

FIG. 1 is a cross-sectional view of a conventional SONOS-type memory device.

Referring to FIG. 1, an ONO layer 20 is formed on a silicon substrate 10 where source and drain regions 30a and 30b are formed. The ONO layer 20 comprises a tunnel oxide layer 12, a nitride layer 14, and an upper oxide layer 16, which are sequentially formed on the silicon substrate 10. A control gate 25 is formed on the ONO layer 20. This SONOS-type memory device is referred to as a stack SONOS-type memory device.

The nitride layer 14 is a memory (storage) layer that controls the threshold voltage (Vth) of a cell and stores data by trapping electric charges in a trap site or emitting the electric charges from the trap site. The upper oxide layer 16 is a blocking layer that prevents the loss of electric charges.

The driving operation of the stack SONOS-type memory cell is as follows. Initially, if a predetermined positive voltage is applied to each of the control gate 25 and the drain region 30b, and the source region 30a is grounded, electrons are injected from an inversion region formed between the source and drain regions 30a and 30b into the tunnel oxide layer 12, and the nitride layer 14 traps the electrons that have passed through the tunnel oxide layer 12. In this operation, data is written or programmed in the memory cell. In FIG. 1, reference character A denotes a trapped electron region. If the control gate 25 is charged with negative charge and a predetermined voltage is applied to the source region 30a, holes in the silicon substrate 10 pass through the tunnel oxide layer 12 and are trapped in the nitride layer 14, and then the trapped holes are recombined with the electrons that have been trapped in the nitride layer 14. In this operation, the written data is erased from the memory cell.

In this stack SONOS-type memory device, although electric charges are stored in a portion (the region A of FIG. 1) of the nitride layer 14, the ONO layer 20 is entirely interposed between the control gate 25 and the silicon substrate 10. Thus, the stack SONOS-type memory device has a high initial threshold voltage and a high program current. Because of the high threshold voltage, power dissipation is high and it is difficult to integrally form the stack SONOS-type cell along with a typical logic device having a low initial threshold voltage in a single chip. Also, since the electrons that are trapped in the nitride layer 14 may move along the nitride layer 14 in a horizontal direction, the erase operation of the SONOS-type memory device may be incomplete. As the program operation and the erase operation are alternately performed, the initial threshold voltage may increase, thus reducing a data retention time.

To solve the above-described problems, a local SONOS-type memory device, in which a charge trapping layer, i.e., a nitride layer, partially overlaps a control gate, was proposed. A conventional local SONOS-type memory device and a method of manufacturing the same will be described with reference to FIGS. 2A through 2C.

Referring to FIG. 2A, a tunnel oxide layer 52, a nitride layer 54, and an upper oxide layer 56 are sequentially stacked on a silicon substrate 50. Next, a first photoresist pattern 58 is formed, and the upper oxide layer 56, the nitride layer 54, and the tunnel oxide layer 52 are patterned using the first photoresist pattern 58.

Referring to FIG. 2B, the first photoresist pattern 58 is removed, and a gate oxide layer 60 is formed on the silicon substrate 50. Thus, while a portion of the silicon substrate 50 is covered by the gate oxide layer 60, the other portion thereof is covered by an ONO layer 62. Thereafter, a conductive layer for a control gate, for example, a polysilicon layer 65, is deposited on the gate oxide layer 60 and the ONO layer 62. A second photoresist pattern 66 is formed on the polysilicon layer 65 to define the length of a control gate.

Referring to FIG. 2C, the polysilicon layer 65 and the ONO layer 62 are patterned using the second photoresist pattern 66, thereby defining the lengths of the control gate 65a and the ONO layer 62. The second photoresist pattern 66 is removed. Here, the control gate 65a overlaps the gate oxide layer 60 and the ONO layer 62. Impurities are doped into the silicon substrate 50, thereby forming source and drain regions 68a and 68b.

In this local SONOS-type cell, the ONO layer 62 partially overlaps the control gate 65a. Thus, the initial threshold voltage and erasing time can be reduced. However, in the local SONOS-type cell, the length of the control gate 65a and the length L of the ONO layer 62 are defined by a photolithography process, which may lead to a loading effect and a misalignment.

For example, the second photoresist pattern 66 for defining the control gate 65a may be misaligned during the photolithography process as shown in FIG. 2B, thus changing the length of the ONO layer 62. That is, if the polysilicon layer 65 and the ONO layer 62 are patterned using the misaligned second photoresist pattern 66' of FIG. 2B, the length of the ONO layer 62 (or the overlap length L1 or L2 of the ONO layer 62 with the control gate 65a) vary for each memory cell.

The operating characteristics, for example, erasing speed, erasing efficiency, and initial threshold voltage, of the local SONOS-type cell depend on the overlap length L of the ONO layer 62 with the control gate 65a, which is almost the same as the length of the nitride layer 54. Accordingly, it is required to minimize a variation in the overlap length L of the ONO layer 62 with the control gate 65a.

For example, when the second photoresist pattern 66 is aligned as shown in FIG. 2C, L is 150 nm. However, when the second photoresist pattern 66' is seriously misaligned as shown in FIG. 3, L1 is about 200 nm and L2 is about 100 nm. This variation in the overlap length causes a variation in the threshold voltage of the local SONOS-type cell. Also, since a patterning process is performed using a photolithography process, the scaling down of a memory device is limited due to the exposure limit of a photolithography apparatus.

SUMMARY OF THE INVENTION

The present invention provides a local SONOS-type memory device, in which cells have a uniform length of an ONO layer and can be scaled down.

The present invention also provides a method of manufacturing a local SONOS-type memory device, which can prevent misalignment due to a photolithography process.

According to an aspect of the present invention, there is provided a local SONOS-type nonvolatile memory device, comprising a gate oxide layer formed on a silicon substrate; a conductive spacer and a dummy spacer, which are formed on the gate oxide layer and separated apart from each other, the conductive spacer and the dummy spacer having round surfaces that face outward; a pair of insulating spacers formed on a sidewall of the conductive spacer and a sidewall of the dummy spacer which face each other; an ONO layer formed in a self-aligned manner between the pair of insulating spacers; a conductive layer formed on the ONO layer in a self-aligned manner between the pair of insulating spacers; and source and drain regions formed in the silicon substrate outside the conductive spacer and the dummy spacer.

The conductive spacer can comprise an extending portion, which is formed on the opposite side of the round surface of the conductive spacer and covers a portion of the gate oxide layer. The size of the conductive spacer can correspond to the sum of the lengths of the spacer and the extending portion. The extending portion can extend as much as the length of the insulating spacer formed on the sidewall of the conductive spacer. The source and drain region formed outside the conductive spacer can overlap the conductive spacer, and the source and drain formed outside the dummy spacer can overlap the conductive layer. The gate oxide layer can be a thermal oxide layer, the conductive spacer and the conductive layer can be formed of polysilicon, and the insulating spacer can be an oxide spacer.

The local SONOS-type nonvolatile memory device can include another local SONOS-type memory device, which is disposed symmetrically in mirror-image relations perpendicular to the source and drain region formed outside the dummy spacer.

According to another aspect of the present invention, there is provided a method of manufacturing a local SONOS-type nonvolatile memory device. The method comprises forming a gate oxide layer on a silicon substrate; forming a conductive spacer and a dummy spacer on the gate oxide layer, the conductive spacer and the dummy spacer being separated apart from each other and having round surfaces that face outward; forming a pair of insulating spacers on a sidewall of the conductive spacer and a sidewall of the dummy spacer which face each other; forming an ONO layer and a conductive layer in a self-aligned manner between the pair of insulating spacers; forming source and drain regions in the silicon substrate outside the conductive spacer and the dummy spacer; and forming a control gate by electrically connecting the conductive spacer to the conductive layer.

The conductive spacer can have an extending portion, which is formed on the opposite side of the round surface of the conductive spacer and covers a portion of the gate oxide layer. The size of the conductive spacer can be changed by controlling the lengths of the spacer and the extending portion. After forming the pair of insulating spacers, the method can include removing the dummy spacer. The forming of the ONO layer and the conductive layer in the self-aligned manner between the pair of insulating spacers can comprise forming an ONO layer on the pair of insulating spacers; patterning the ONO layer such that the ONO layer remains only between the pair of insulating spacers; forming a conductive layer on the patterned ONO layer; and patterning the conductive layer such that the conductive layer remains only between the pair of insulating spacers.

According to yet another aspect of the present invention, there is provided a method of manufacturing a local SONOS-type nonvolatile memory device. The method comprises forming insulating patterns on a silicon substrate, the insulating patterns being separated by an opening; forming undercuts by removing portions of the insulating patterns, which are positioned on the opposite side of the opening; forming a gate oxide layer on the entire surface of the silicon substrate between the silicon substrate and the insulating patterns; forming a conductive spacer and a dummy spacer on sidewalls of the insulating patterns; removing the insulating patterns; forming a first source and drain region by implanting impurities into the silicon substrate via the opening; forming a pair of insulating spacers on a sidewall of the conductive spacer and a sidewall of the dummy spacer that face each other; forming an ONO layer and a conductive layer in a self-aligned manner between the pair of insulating spacers; forming a second source and drain region by implanting impurities into the silicon substrate outside the conductive spacer; and forming a control gate by electrically connecting the conductive spacer to the conductive layer.

Each of the insulating patterns can be formed of a stack of an oxide layer and a nitride layer, and the undercuts can be formed by etching the oxide layer using a wet etch process. In one embodiment, each of the insulating patterns is formed of a stack of two or more layers, which have a high etch selectivity with respect to each other, and the undercuts are formed by etching a lowest layer of each of the insulating patterns.

The conductive spacer can be formed so as to fill the undercuts. The size of the conductive spacer can be controlled by adjusting the depth of the undercuts. The gate oxide layer can be formed of a thermal oxide layer. The conductive spacer can be formed of polysilicon. The insulating spacer can be formed of an oxide layer. The nitride layer can be formed to a thickness of about 50 Å to 200 Å. The method can further comprise diffusing the first source and drain region such that the first source and drain region overlaps the conductive layer. The conductive layer can be formed of polysilicon, polycide, or metal, and the silicide can be tungsten silicide, cobalt silicide, or titanium silicide.

In one embodiment, the forming of the ONO layer and the conductive layer in a self-aligned manner between the pair of insulating spacers comprises: forming an ONO layer on the pair of insulating spacers; patterning the ONO layer such that the ONO layer remains only between the pair of insulating spacers; forming a conductive layer on the patterned ONO layer; and patterning the conductive layer such that the conductive layer remains only between the pair of insulating spacers. In the present invention, since an ONO layer is formed inside a pair of insulating spacers using a self-alignment process, a memory cell is not affected by the exposure limit of a photolithography process and can be greatly scaled down. Also, variations in the lengths of a control gate and an ONO layer and a variation in the overlap length therebetween can be minimized. Accordingly, cells can have uniform operating characteristics.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
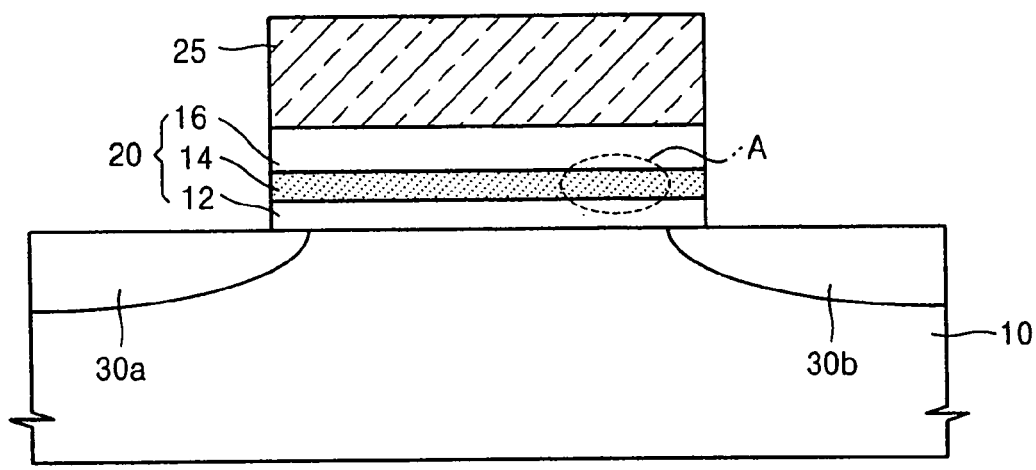
FIG. 1 is a cross-sectional view of a conventional SONOS-type nonvolatile memory device.
Figure 2A:
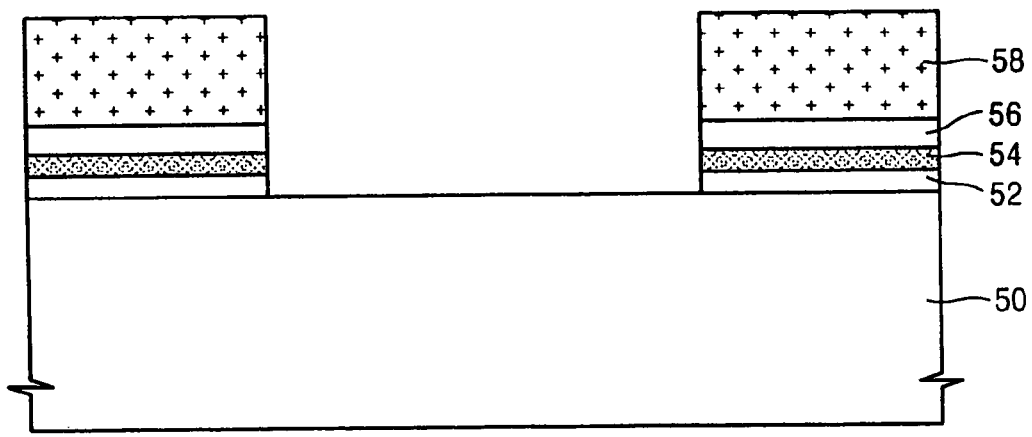
FIGS. 2A through 2C are cross-sectional views illustrating a method of manufacturing a conventional local SONOS-type nonvolatile memory device.
Figure 2B:
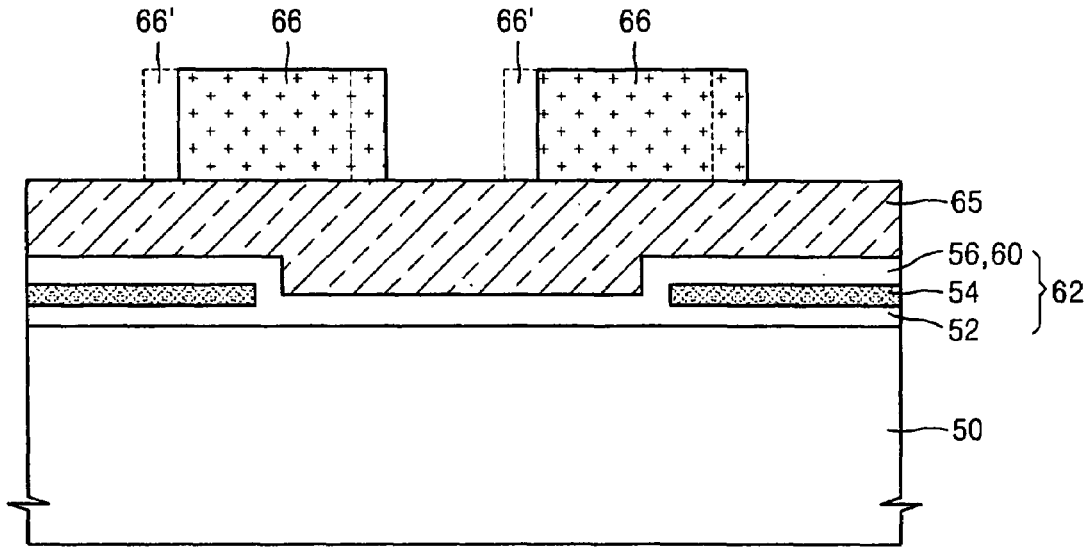
Figure 2C:
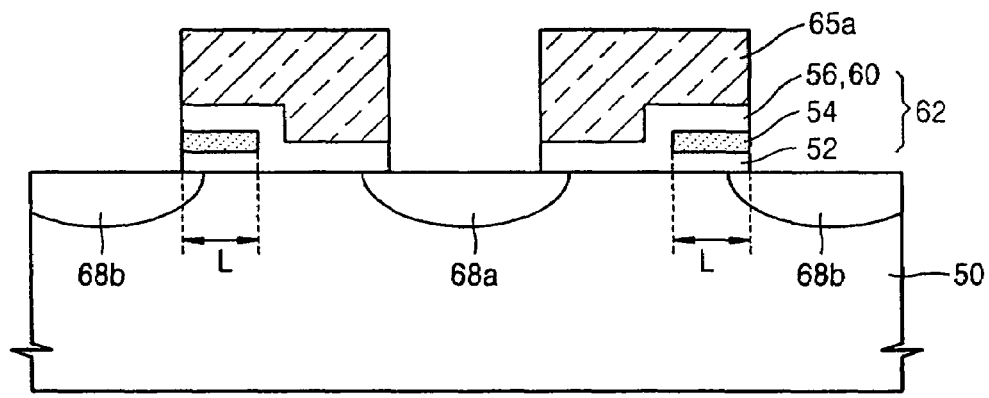
Figure 3:
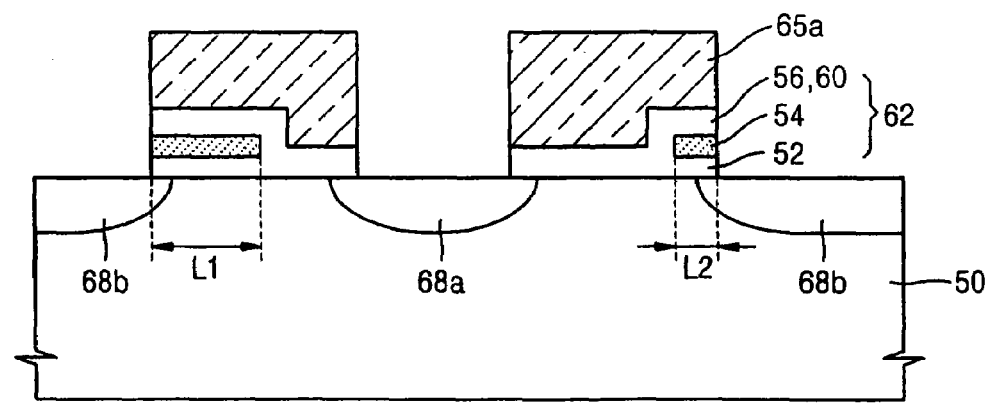
FIG. 3 is a cross-sectional view of a conventional local SONOS-type nonvolatile memory device, in which a misalignment occurs.

In the drawings, the forms of elements are exaggerated for clarity. FIGS. 4 through 14 are cross-sectional views illustrating a method of manufacturing a local SONOS-type nonvolatile memory device according to an embodiment of the present invention.

Figure 4:
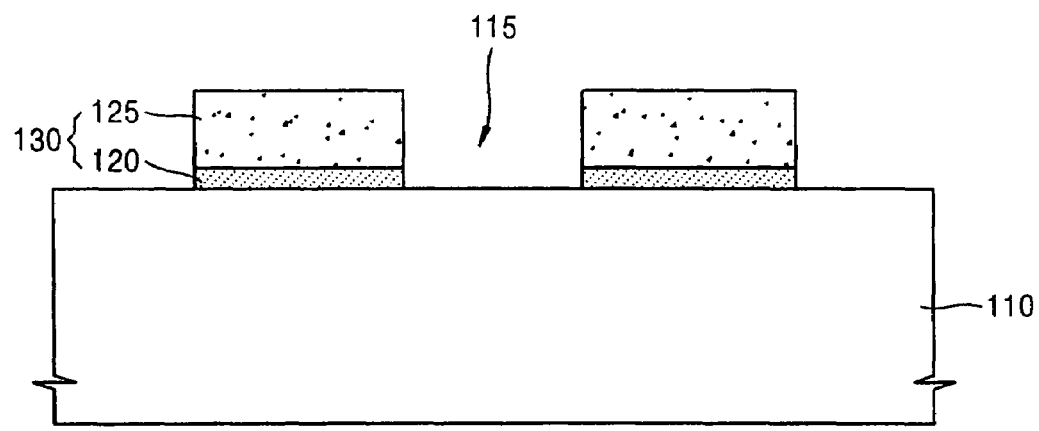
FIGS. 4 through 14 are cross-sectional views illustrating a method of manufacturing a local SONOS-type nonvolatile memory device according to an embodiment of the present invention.

Referring to FIG. 4, insulating patterns 130 are formed on a silicon substrate 110 and separated by an opening 115. An insulating pattern 130 can be comprised of two stacked layers, which have a high etch selectivity with respect to each other. In one embodiment, the insulating pattern 130 is comprised of an oxide layer 120 and a nitride layer 125, which are sequentially stacked. To form the insulating pattern 130, the oxide layer 120 and the nitride layer 125 are deposited on the entire surface of the silicon substrate 110 and patterned by a photolithography process using a first photoresist pattern (not shown), which is formed to define the opening 115. Thereafter, the first photoresist pattern is removed by ashing and stripping. In one embodiment, an oxynitride layer can be used instead of the nitride layer 125. The height of conductive spacers that will be formed on sidewalls of the insulating pattern 130 in a subsequent process depends on the thickness of the insulating pattern 130. Thus, the thicknesses of the oxide layer 120 and the nitride layer 125, which constitute the insulating pattern 130, should be determined considering the height of the conductive spacers.

The oxide layer 120 can be a silicon oxide layer and can be formed using a typical deposition method, for example, chemical vapor deposition (CVD), sub-atmospheric CVD (SACVD), low-pressure CVD (LPCVD), or plasma-enhanced CVD (PECVD), or thermal oxidation. If the CVD is used, the oxide layer 120 can be formed of middle-temperature oxide (MTO) using $SiH_4$ gas, $Si_2H_6$ gas, and $N_2O$ gas as a reaction gas. The oxide layer 120 is formed to an appropriate thickness of, for example, about 500 Å to 1000 Å, considering the thickness of conductive spacers and the size of a memory device to be fabricated.

The nitride layer 125 can be a silicon nitride layer and can be formed at a temperature of about 500° C. to 850° C. by LPCVD using a reaction of $SiH_4$ with $NH_3$. Like the oxide layer 120, the nitride layer 125 is formed to an appropriate thickness of, for example, about 1000 Å to 3000 Å, considering the thickness of conductive spacers and the size of a memory device.

Figure 5:
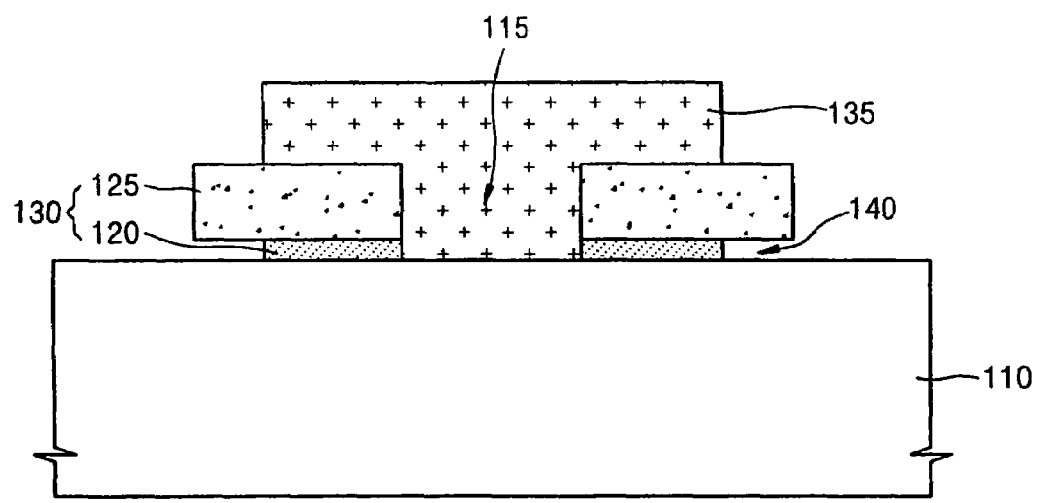

Referring to FIG. 5, a second photoresist pattern 135 is formed to protect a portion of the oxide layer 120, which is adjacent to the oxide layer 120, and the exposed portions of the oxide layer 120 on the opposite side of the opening 115 are wet etched to thereby form undercuts 140. For example, the sidewalls of the oxide layer 120 are exposed to a HF diluted solution so as to form the undercuts 140. The HF diluted solution can be a mixture of HF and deionized water ($H_2O$) in a ratio of 1:5 to 1:1000. A buffered oxide etchant (BOE) can be used instead of the HF diluted solution. Since the oxide layer 120 has a high etch selectivity with respect to the nitride layer 125, only the oxide layer 120, not the nitride layer 125, is etched by a wet etch process to form the undercuts 140. Subsequently, a portion of the conductive spacers is formed in the undercuts 140. Thus, since the depth of the undercuts 140 is used to define the size of the conductive spacers, the undercuts 140 are preferably formed considering the size of the conductive spacers. In the present embodiment, the undercuts 140 are formed to a depth of, for example, about 50 nm to 100 nm. After the undercuts 140 are formed, the second photoresist pattern 135 is removed.

The insulating pattern 135 may not be comprised of a stack of an oxide layer and a nitride layer to form the undercuts 140. If the insulating pattern 135 is formed of an insulating layer, the undercuts 140 can be formed by removing a portion of a lower portion of the insulating pattern 135.

Figure 6:
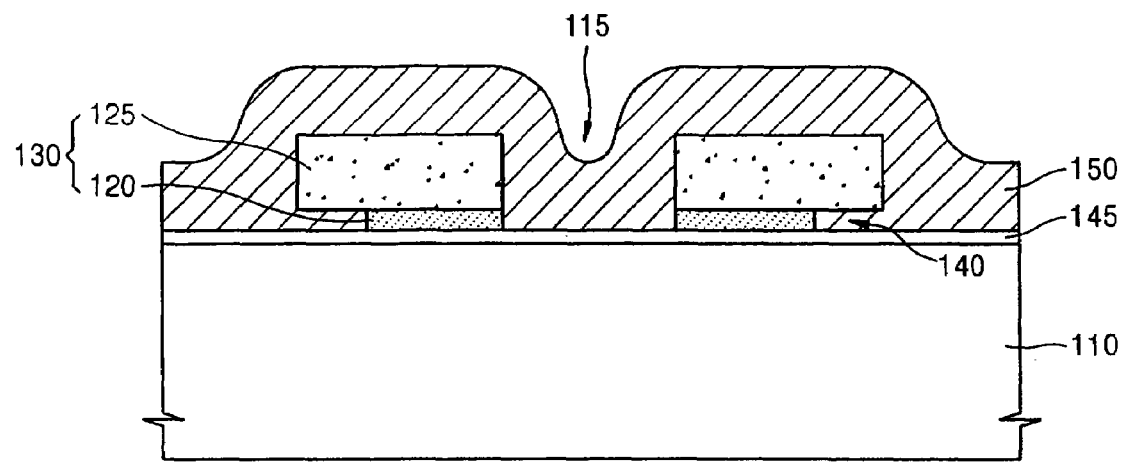

Referring to FIG. 6, a gate oxide layer 145 is formed on the entire surface of the silicon substrate 110 between the silicon substrate 110 and the insulating patterns 130. The gate oxide layer 145 can be a thermal oxide layer. A polysilicon layer 150 is formed on the entire surface of the resultant structure where the gate oxide layer 145 is formed. The polysilicon layer 150 is deposited using LPCVD to improve a step coverage characteristic such that the undercuts 140 are filled. The polysilicon layer 150 is formed to such a thickness that the opening 115 is not completely filled with the polysilicon layer 150, because the polysilicon layer 150 will be anisotropically etched in the shape of spacers in a subsequent process. Like the depth of the undercuts 140, the width of the spacers that are formed by anisotropically etching the polysilicon layer 150 is used to define the size of the conductive spacers. Since the thickness of the polysilicon layer 150 determines the width of the spacers, the polysilicon layer 150 should be formed to an appropriate thickness to form a desired size of conductive spacers. For example, the polysilicon layer 150 is formed to a thickness of about 1000 Å to 3000 Å. The polysilicon layer 150 can be deposited and doped with impurities at the same time in situ. Alternatively, an undoped polysilicon can be formed beforehand and then doped with impurities later. In one embodiment, phosphorus (P) ions can be implanted into the polysilicon layer 150 at an energy of about 30 KeV and at a dose of about $2.7 \times 10^{14}$ ions/cm$^2$.

Figure 7:
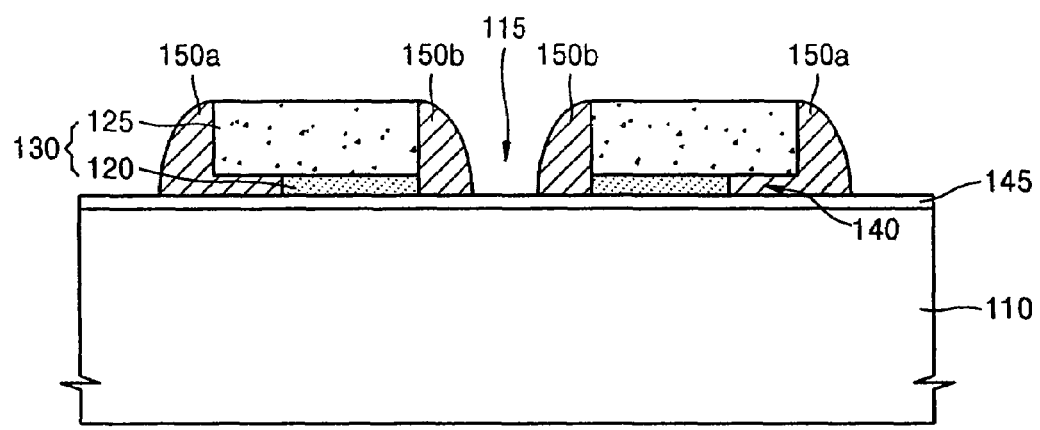

Thereafter, the polysilicon layer 150 is anisotropically etched to thereby form conductive spacers 150a and dummy spacers 150b on sidewalls of the insulating patterns 130 as shown in FIG. 7. The polysilicon layer 150 can be etched using a gas mixture of HBr, $O_2$, $N_2$, and $CF_4$ as an etch gas. A bias power may be applied toward the silicon substrate 110 to make the etch gas go straight. As shown in FIG. 7, the conductive spacers 150a formed on the opposite side of the opening 115 are formed to fill the undercuts 140. The conductive spacers 150a of the present embodiment are formed without using a photolithography process and, therefore, are not affected by the exposure limit of a photolithography apparatus. Accordingly, as the conductive spacers 150a can be further scaled down, memory cells can be scaled down.

Figure 8:
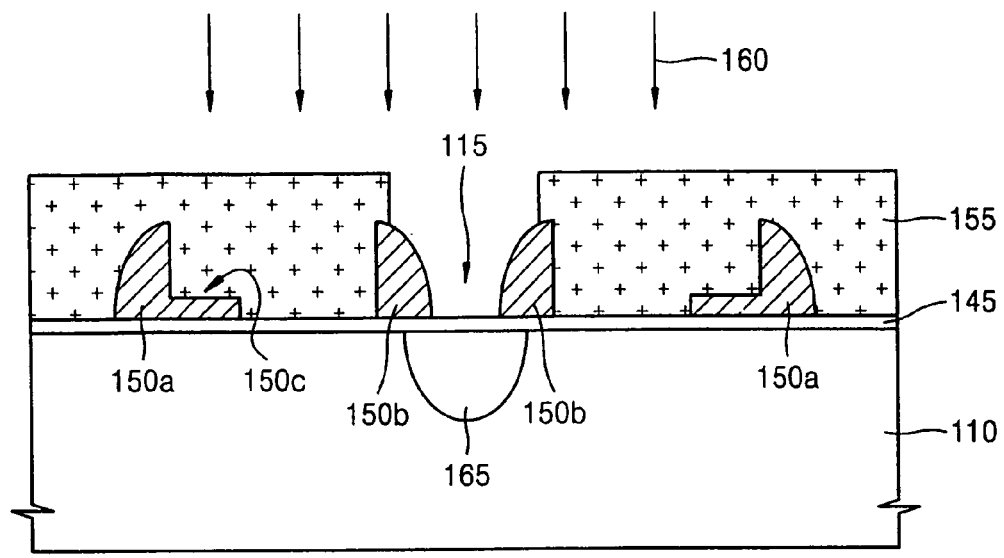

Referring to FIG. 8, the insulating patterns 130 are removed. Then, extending portions 150c of the conductive spacers 150a, which cover portions of the gate oxide layer 145, are exposed. The size of the conductive spacers 150a corresponds to the sum of the lengths of the spacers and the extending portions 150c. Thus, the size of the conductive spacers 150a can be controlled by adjusting the size of the spacers and/or the length of the extending portions 150c, i.e., the depth of the undercuts 140. Thereafter, a third photoresist pattern 155 is formed such that the opening 115 is exposed, and impurities 160 are implanted via the opening 115 using the third photoresist pattern 155 as an ion implantation mask, to thereby form a first source and drain region 165 in the silicon substrate 110.

Figure 9:
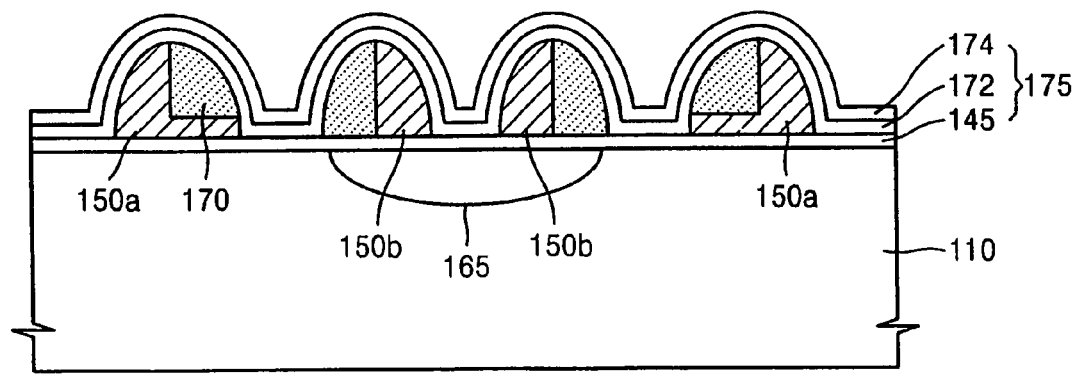

Referring to FIG. 9, the third photoresist pattern 155 is removed, and an oxide layer having a thickness of 500 Å to 2000 Å is formed on the entire surface of the resultant structure and anisotropically etched. Thus, a pair of insulating spacers 170 is formed on a sidewall of the conductive spacer 150a and a sidewall of the dummy spacer 150b which face each other. The extending portion (150c of FIG. 8) of the conductive spacer 150a extends as much as the length of the insulating spacer 170 formed on the sidewall of the conductive spacer 150a. The dummy spacer 150b is naturally formed during the formation of the conductive spacer 150a and performs no electrical functions. The reason why the dummy spacer 150b is not removed and left even after the conductive spacer 150a is formed is to form pairs of insulating spacers 170 as described above. These pairs of insulating spacers 170 are used in a subsequent process to form an ONO layer in a self-aligned manner. After the pairs of insulating spacers 170 are formed, the dummy spacers 150b may be removed.

Next, a nitride layer 172 and an oxide layer 174 are formed on the pairs of the insulating spacers 170 and constitute an ONO layer 175 along with the gate oxide layer 145 disposed thereunder. Alternatively, to form the ONO layer 175, an additional oxide layer (not shown) may be formed on the gate oxide layer 145, and the nitride layer 172 and the oxide layer 174 may be formed thereon. The nitride layer 172 can be formed using LPCVD to a thickness of about 50 Å to 200 Å. The oxide layer 174 can be formed using CVD or thermal oxidation. The formed oxide layer 174 is thermally treated at a temperature of 1000° C. for about 30 minutes to improve the reliability thereof. The first source and drain region 165, as described with reference to FIG. 8, is continuously exposed to thermal processes while the nitride layer 172 and the oxide layer 174 are being formed. Accordingly, the first source and drain region 165 may gradually diffuse to, for example, overlap the insulating spacers 170.

Figure 10:
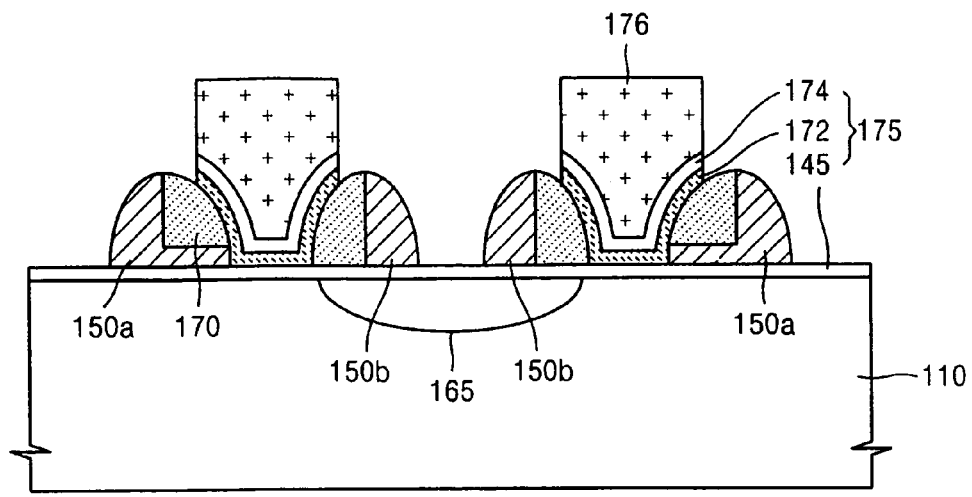

Referring to FIG. 10, a fourth photoresist pattern 176 is formed between the pairs of insulating spacers 170, and the exposed ONO layer 175 is etched using the fourth photoresist pattern 176. Thus, the ONO layer 175 is patterned and formed in a self-aligned manner between the pairs of insulating spacers 170. The patterning of the ONO layer 175 is performed not to define the length of the ONO layer 175 but to separate adjacent ONO layers 175. Hence, even if a misalignment occurs during the patterning of the ONO layer 175, the length of the ONO layer 175 formed between the insulating spacers 170 is the same irrespective of cells. Thus, the cells can have uniform characteristics.

Figure 11:
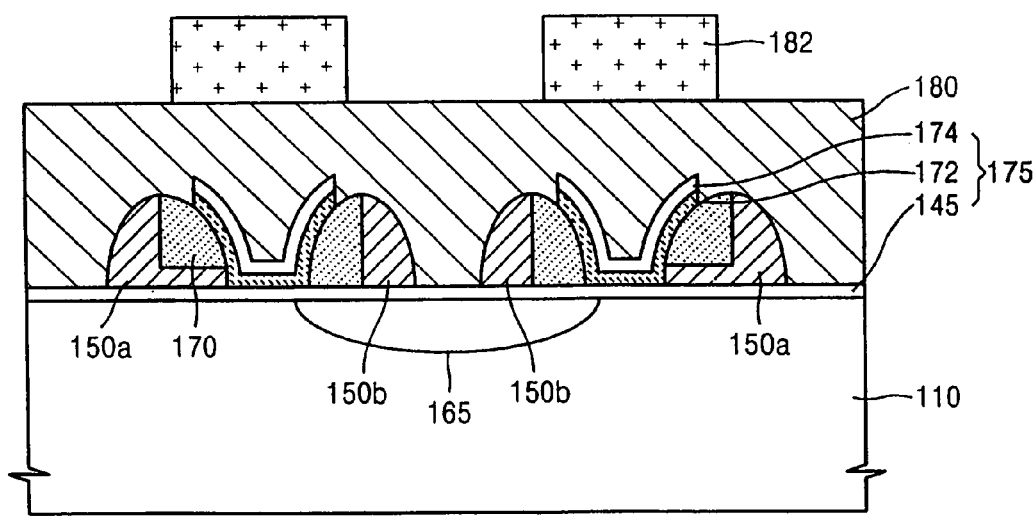

Referring to FIG. 11, the fourth photoresist pattern 176 is removed, and a conductive layer 180 is formed on the entire surface of the resultant structure. The conductive layer 180 can be a polysilicon layer, a silicide layer, a polycide layer, or a metal layer and formed to a thickness of about 2000 Å. If the conductive layer 180 is a silicide layer, tungsten silicide, cobalt silicide, or titanium silicide can be used. To form the cobalt silicide or titanium silicide, cobalt or titanium is formed on polysilicon, which is deposited on the resultant structure, and rapid thermal annealing (RTA) is performed to allow the polysilicon to react on the cobalt or titanium. If a cobalt layer is formed as the conductive layer 180, a primary RTA is performed in a $N_2$ atmosphere at a temperature of about 400° C. to 500° C. for about 50 seconds so as to allow polysilicon to react on cobalt. Thus a CoSi layer is formed. Next, a secondary RTA is performed on the resultant structure in a $N_2$ atmosphere at a temperature of about 800° C. to 900° C. for about 30 seconds. Thus, a $CoSi_2$ layer, which is less resistive than the CoSi layer, is formed. If a nickel layer is formed as the conductive layer 180, a NiSi layer can be obtained by performing one-step thermal treatment at a low temperature. A tungsten silicide layer as the conductive layer 180 can be deposited using CVD. A polycide layer is a stack of the foregoing polysilicon layer and silicide layer. The first source and drain region 165 may further diffuse to go beyond the insulating spacer 170.

Figure 12:
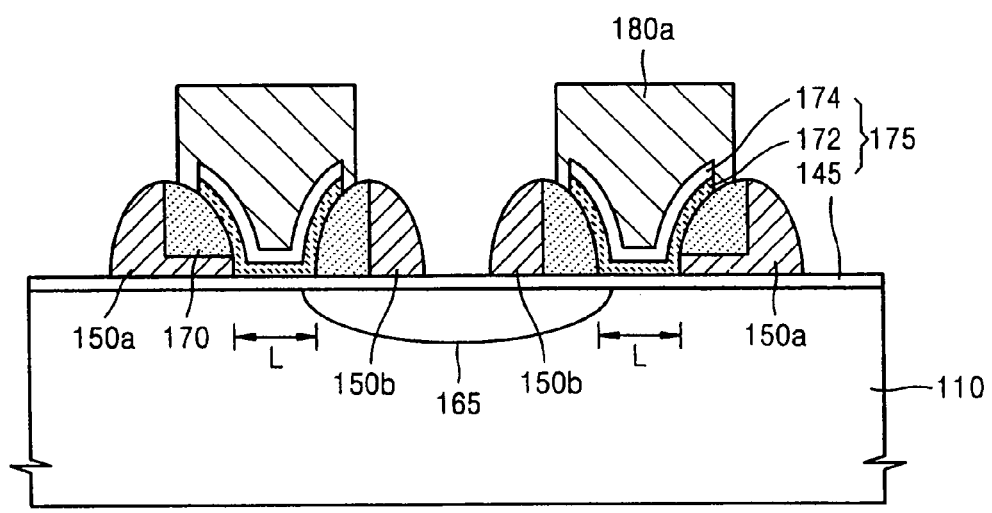

Next, a fifth photoresist pattern 182 is formed, and the exposed conductive layer 180 is etched using the fifth photoresist pattern 182. Thereafter, the fifth photoresist pattern 182 is removed. Thus, the resultant structure of FIG. 12 is obtained. The patterned conductive layer 180a is aligned between the insulating spacers 170 such that the overlap length between the conductive layer 180a and the ONO layer 175 is the same irrespective of cells. The patterning of the conductive layer 180a is performed only to separate the conductive layers 180 of adjacent cells. The conductive layer 180a is electrically connected to the conductive spacers 150a in a subsequent process and forms a control gate. Hence, even if a misalignment occurs during the patterning of the conductive layer 180a, the overlap length between the conductive layer 180a and the ONO layer 175 (that is, the overlap length between the ONO layer 175 and the control gate or the effective channel length L of the control gate) is the same irrespective of the cells. Thus, even if the misalignment occurs, the cells can have uniform characteristics.

The first source and drain region 165 overlaps the conductive layer 180a. In this case, a channel-off region, which is generated by the dummy spacer 150b and the insulating spacer 170 unless the first source and drain region 165 overlaps the conductive layer 180a, can be prevented. The first source and drain region 165 functions as a source region of a cell.

Figure 13:
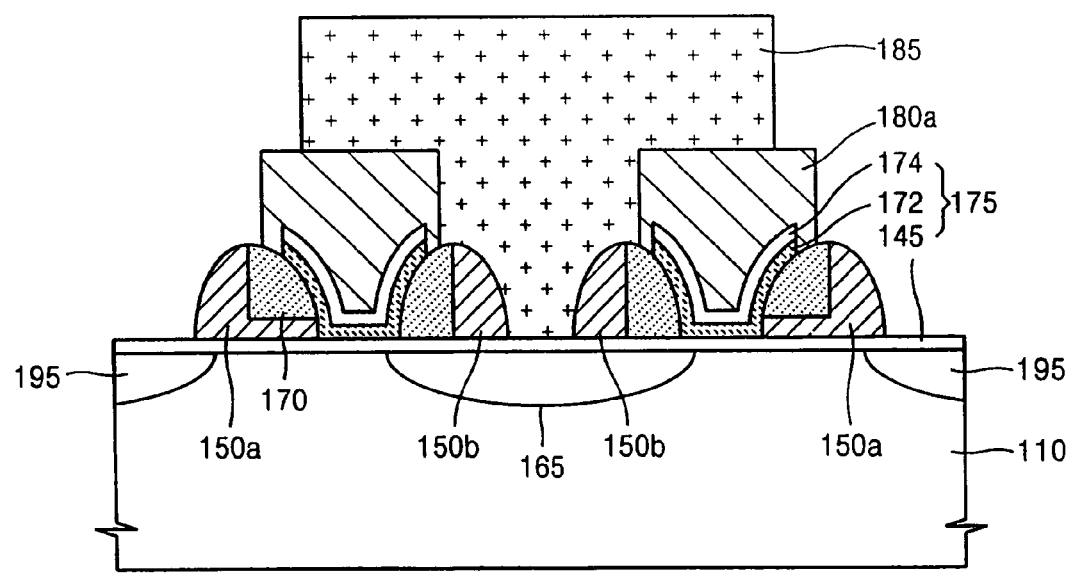

Referring to FIG. 13, a sixth photoresist pattern 185 is formed such that outer portions of the conductive spacers 150a are exposed. Impurities are implanted into the silicon substrate 110 using the sixth photoresist pattern 185 as an ion implantation mask, to thereby form a second source and drain region 195. The sixth photoresist pattern 185 is removed, and the resultant structure can be thermally treated such that the second source and drain region 195 overlaps the conductive spacer 150a. The second source and drain region 195 can be subsequently connected to a bit line.

Figure 14:
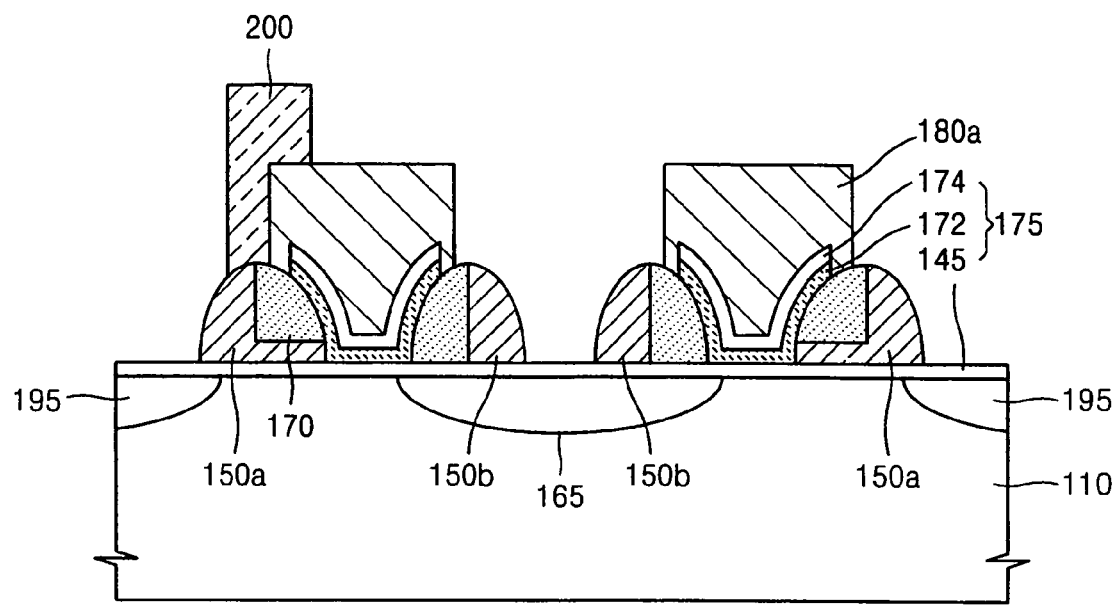

Referring to FIG. 14, the conductive spacer 150a is electrically connected to the conductive layer 180a by a contact plug 200 such that the conductive spacer 150a and the conductive layer 180a are used as a control gate. In FIG. 14, interlayer dielectric or the like are not shown.

As shown in FIG. 14, a local SONOS-type memory device of the present invention comprises a gate oxide layer 145 formed on a silicon substrate 110. The conductive spacer 150a and the dummy spacer 150b are formed on the gate oxide layer 145 and separated apart from each other. Also, round surfaces of the conductive spacer 150a and the dummy spacer 150b face outward. The pair of the insulating spacers 170 are formed between the sidewall of the conductive spacer 150a and the sidewall of the dummy spacer 150b, which face each other. The ONO layer 175 and the conductive layer 180a are formed in a self-aligned manner between the pair of insulating spacers 170. The first and second source and drain regions 165 and 195 are formed in the silicon substrate 110 outside the conductive spacer 150a and the dummy spacer 150b. The second source and drain region 195 formed outside the conductive spacer 150a overlaps the conductive spacer 150a, and the first source and drain region 165 formed outside the dummy spacer 150b overlaps the conductive layer 180a. The conductive layer 180a is electrically connected to the conductive spacer 150a and forms a control gate. Also, the local SONOS-type memory device is disposed symmetrically in mirror-image relations perpendicular to the first source and drain region 165.

Figure 15:
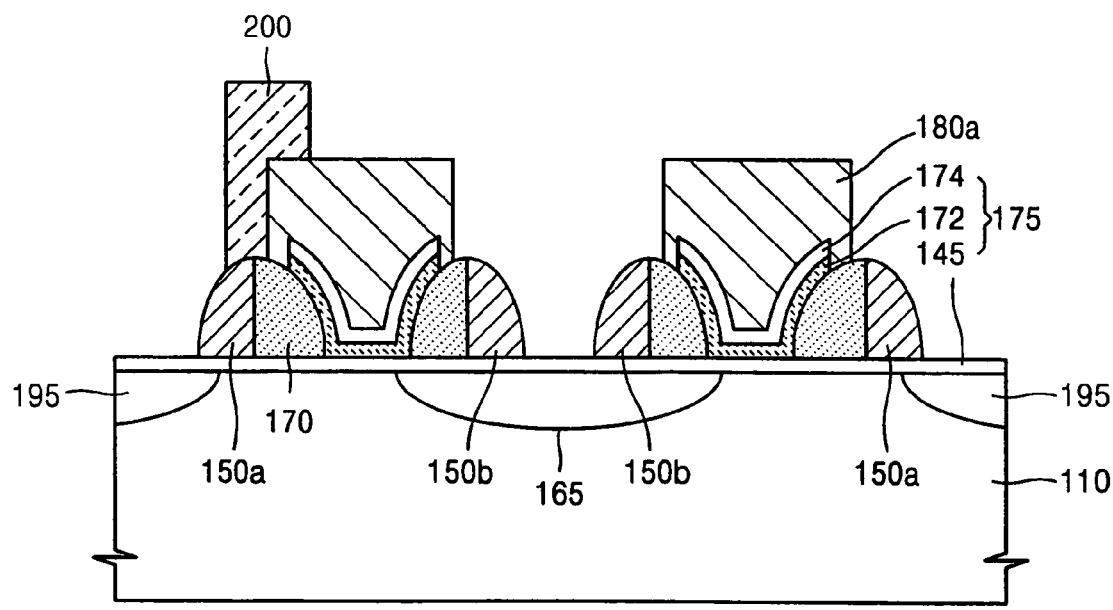
FIG. 15 is a cross-sectional view of a local SONOS-type nonvolatile memory device according to another embodiment of the present invention.

FIG. 15 is a cross-sectional view of a local SONOS-type memory device according to another embodiment of the present invention. In FIG. 15, a conductive spacer 150a does not have an extending portion (see 150c of FIG. 8). If the conductive spacer 150a can secure a sufficient length without the extending portion, the structure of FIG. 15 can be obtained in the same manner as in the first embodiment without performing the forming of the undercuts 140 as described with reference to FIG. 5. In the present embodiment, an insulating pattern 130 of FIG. 4 may not be formed of a stack of two or more material layers.

Figure 16:
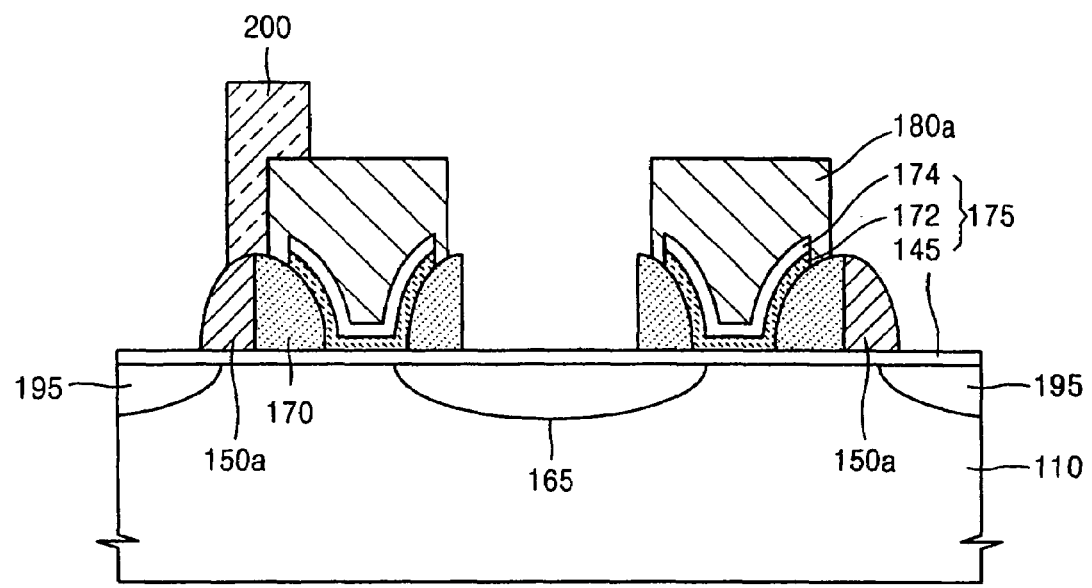
FIG. 16 is a cross-sectional view of a local SONOS-type nonvolatile memory device according to yet another embodiment of the present invention.

FIG. 16 is a cross-sectional view of a local SONOS-type memory device according to yet another embodiment of the present invention. The present embodiment is the same as the first embodiment except that after pairs of insulating spacers 170 are formed, dummy spacers (150b of FIG. 9) are removed. The dummy spacers can be removed during any subsequent process after the pairs of the insulating spacers 170 are formed.

Figure 17:
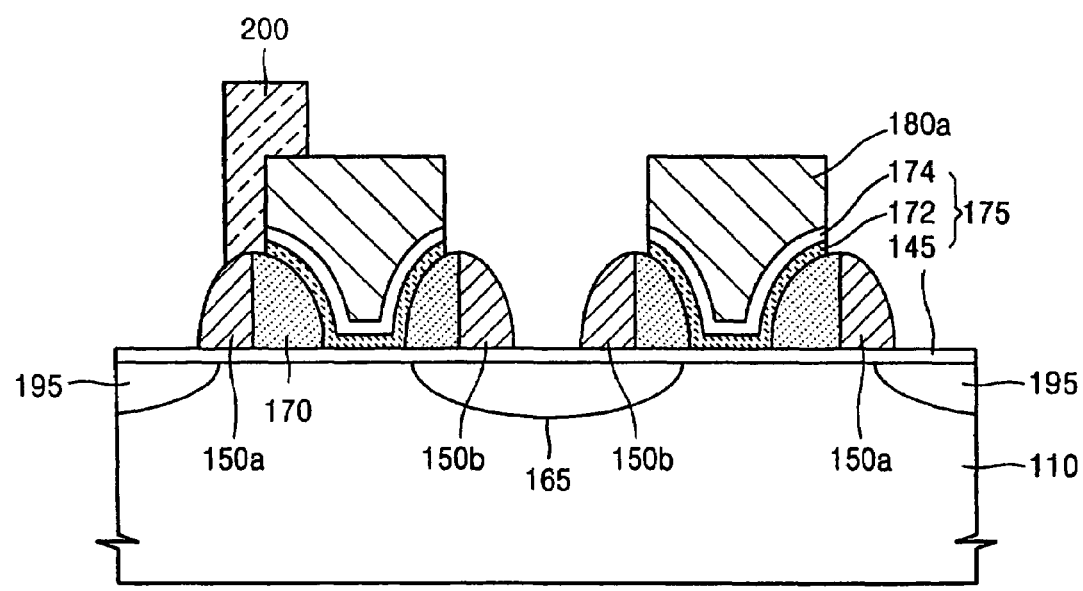
FIG. 17 is a cross-sectional view of a local SONOS-type nonvolatile memory device according to further another embodiment of the present invention.

FIG. 17 is a cross-sectional view of a local SONOS-type memory device according to yet another embodiment of the present invention. In the first embodiment as described with reference to FIGS. 9 through 12, when the ONO layer 175 and the conductive layer 180 are patterned in a self-aligned manner, after the ONO layer 175 is patterned, the conductive layer 180 is patterned. However, the ONO layer 175 and the conductive layer 180 can be patterned at the same time using only one photolithography process. Thus, as shown in FIG. 17, the patterned ONO layer 175 and the conductive layer 180a have sidewalls, which are on the same plane with each other.

Figure 18:
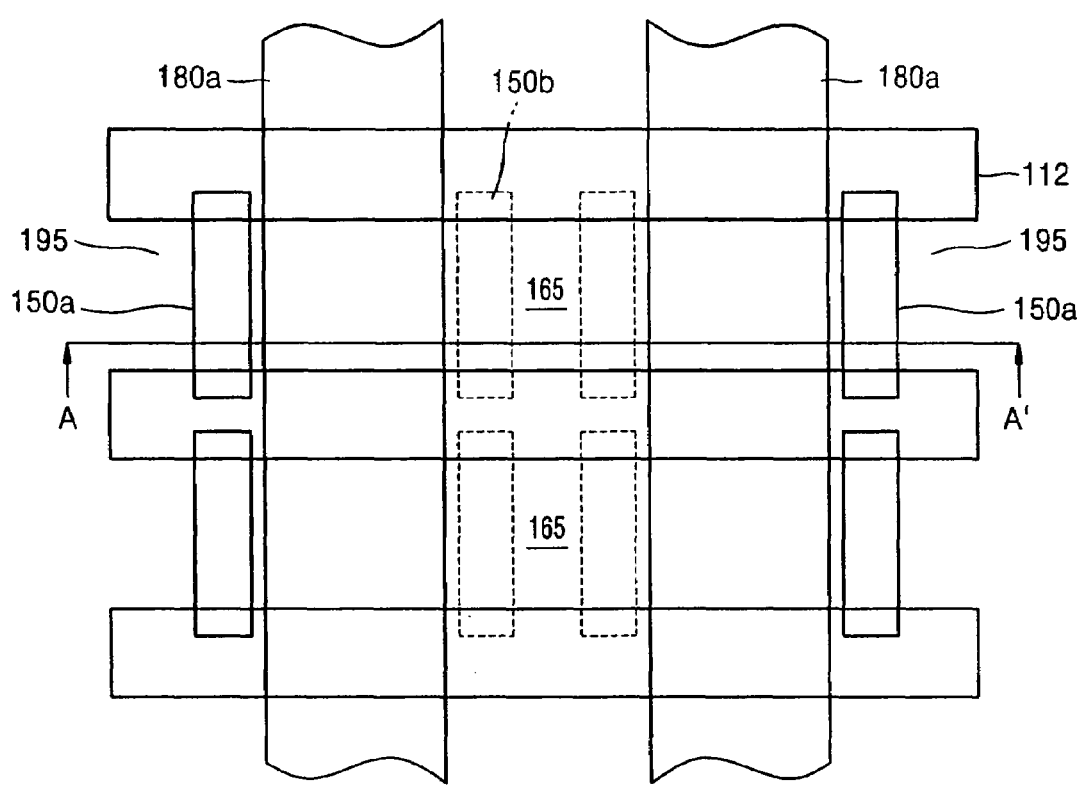
FIG. 18 illustrates the layout of the local SONOS-type nonvolatile memory devices shown in FIGS. 14 through 17.

FIG. 18 illustrates the layout of the local SONOS-type memory device of the embodiments of the present invention. In FIG. 18, reference numeral 112 denotes an isolation layer. The conductive spacers 150a, the conductive layers 180a, and the source and drain regions 195 and 165 are disposed as illustrated with solid lines. The dummy spacers 150b illustrated with dotted lines may be omitted in a final structure. In FIG. 18, the section taken along line A-A' corresponds to FIGS. 14 through 17.

As described above, the present invention uses a self-alignment process instead of a photolithography process that leads to a misalignment. Thus, variations in the lengths of a control gate and an ONO layer and a variation in the overlap length therebetween can be minimized. Accordingly, cells can have uniform operating characteristics.

Further, since a conductive spacer, which constitutes a portion of a control gate, is formed using a spacer forming process, a memory cell is not affected by the exposure limit of a photolithography process and can be greatly scaled down. The size of the conductive spacer can be changed by controlling the lengths of a spacer and/or an extending portion.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A local SONOS-type nonvolatile memory device comprising:
   a gate oxide layer formed on a silicon substrate;
   a conductive spacer and a dummy spacer, which are formed on the gate oxide layer and separated apart from each other, the conductive spacer and the dummy spacer having round surfaces that face outward;
   a pair of insulating spacers formed on a sidewall of the conductive spacer and a sidewall of the dummy spacer which face each other;
   an ONO layer formed in a self-aligned manner between the pair of insulating spacers;
   a conductive layer formed on the ONO layer in a self-aligned manner between the pair of insulating spacers; and
   source and drain regions formed in the silicon substrate outside the conductive spacer and the dummy spacer.

2. The device of claim 1, wherein the conductive spacer comprises an extending portion, which is formed on the opposite side of the round surface of the conductive spacer and covers a portion of the gate oxide layer.

3. The device of claim 2, wherein the extending portion extends as much as the length of the insulating spacer formed on the sidewall of the conductive spacer.

4. The device of claim 1, wherein the source and drain region formed outside the conductive spacer overlaps the conductive spacer, and the source and drain formed outside the dummy spacer overlaps the conductive layer.

5. The device of claim 1, wherein the conductive spacer is formed of polysilicon.

6. The device of claim 1, wherein the insulating spacer is an oxide spacer.

7. The device of claim 1, further comprising another local SONOS-type memory device according to claim 1, which is disposed symmetrically in mirror-image relations perpendicular to the source and drain region formed outside the dummy spacer.

* * * * *